United States Patent
Seto (10) Patent No.: US 8,030,171 B2
(45) Date of Patent: Oct. 4, 2011

(54) METHOD OF FORMING ELEMENT ISOLATION FILM AND NONVOLATILE SEMICONDUCTOR MEMORY

(75) Inventor: Masaru Seto, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 293 days.

(21) Appl. No.: 11/878,378

(22) Filed: Jul. 24, 2007

(65) Prior Publication Data

US 2008/0057669 A1    Mar. 6, 2008

(30) Foreign Application Priority Data

Aug. 30, 2006  (JP) ................. 2006-234297

(51) Int. Cl.
*H01L 21/76* (2006.01)

(52) U.S. Cl. ........... 438/425; 257/E21.545; 257/E21.55; 438/221; 438/296; 438/359; 438/362; 438/424; 438/435; 438/437; 438/439

(58) Field of Classification Search ........... 257/E21.545, 257/E21.55; 438/221, 296, 359, 362, 424, 438/425, 435, 437, 439
See application file for complete search history.

(56) References Cited

U.S. PATENT DOCUMENTS

| 6,313,010 B1 * | 11/2001 | Nag et al. ................ 438/435 |
| 6,576,530 B1 * | 6/2003 | Chen et al. ............... 438/435 |
| 6,818,936 B2 * | 11/2004 | Lin et al. ................. 257/300 |

FOREIGN PATENT DOCUMENTS

| JP | 2002-222855 | 8/2002 |
| JP | 2002-289683 | 10/2002 |
| JP | 2003-188251 | 7/2003 |
| JP | 2003-318257 | 11/2003 |
| JP | 2005-311279 | 11/2005 |

* cited by examiner

*Primary Examiner* — Asok Sarkar
(74) *Attorney, Agent, or Firm* — Rabin & Berdo, PC (57) ABSTRACT

An element isolation film is formed by filling an oxide in a trench formed in an element isolation region of a semiconductor substrate to thereby form an insulation film for element isolation. A method of forming the element isolation film includes a first step of depositing a material in a plasma state including oxygen and silicon on an inner surface of the trench while applying no bias voltage (or a relatively low voltage), and a second step of filling the material in a plasma state including oxygen and silicon in the trench while applying a bias voltage (or a relatively high voltage).

3 Claims, 7 Drawing Sheets

METHOD OF FORMING ELEMENT ISOLATION FILM AND NONVOLATILE SEMICONDUCTOR MEMORY

BACKGROUND OF THE INVENTION

This invention relates to a method for forming an element isolation film having an STI (Shallow Trench Isolation) structure, and also relates to a nonvolatile semiconductor memory using the element isolation film.

Due to the increasing speed and density of the semiconductor device, a conventional element isolation film of LOCOS (Local Oxidation of Silicon) oxide film has been replaced by an element isolation film having the STI structure.

The element isolation film having the STI structure is obtained by forming a trench (i.e., a concave portion) on a substrate to a depth required for element isolation by etching, forming an insulation film to fill the trench with the insulation film, and removing the insulation film protruding out of the trench using a planarization process. The insulation film is formed of an HDP (High Density Plasma) oxide film having little defect and having high insulation properties.

The following patent publication No. 1 discloses a flash memory element using an HDP oxide film as a buried insulation film of the STI structure, and manufacturing method thereof. The following patent publication Nos. 2 and 3 disclose techniques for preventing the occurrence of defects on edge portions of the insulation film of the STI structure. The following patent publication Nos. 4 and 5 disclose techniques for preventing the degradation of the characteristics of the element in association with the prevention of the defect on the edge portion of the insulation film of the STI structure.

Patent Document No. 1: Japanese Laid-open Patent Publication 2005-311279.

Patent Document No. 2: Japanese Laid-open Patent Publication 2003-318257.

Patent Document No. 3: Japanese Laid-open Patent Publication 2003-188251.

Patent Document No. 4: Japanese Laid-open Patent Publication 2002-222855.

Patent Document No. 5: Japanese Laid-open Patent Publication 2002-289683.

However, in the manufacturing methods disclosed in either of the above described publications, the HDP oxide film is formed in a single step, and therefore the substrate may be electrically charged by charged particles of plasma or the like. In such a case, a threshold may vary and a leak current may occur, and there is a possibility that the characteristics of the element may become unstable. Particularly, in the case of the nonvolatile memory such as a flash memory or the like having a floating gate structure, there is a possibility that contents of the memory may be lost due to the unstable characteristics of the element.

SUMMARY OF THE INVENTION

An object of the present invention is to provide a nonvolatile semiconductor memory having stable characteristics, and to provide a method for forming an element isolation film of the nonvolatile semiconductor memory.

The present invention provides a method for forming an element isolation film by filling a trench formed in an element isolation region of a semiconductor substrate with an oxide to thereby form an insulation film for element isolation. The method includes a first step of depositing a material in a plasma state including oxygen and silicon on an inner surface of the trench, and a second step of filling the trench with a material in a plasma state including oxygen and silicon while applying a bias voltage. In the first step, the material in the plasma state is applied with no bias voltage or a relatively low bias voltage compared with the bias voltage applied in the second step.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
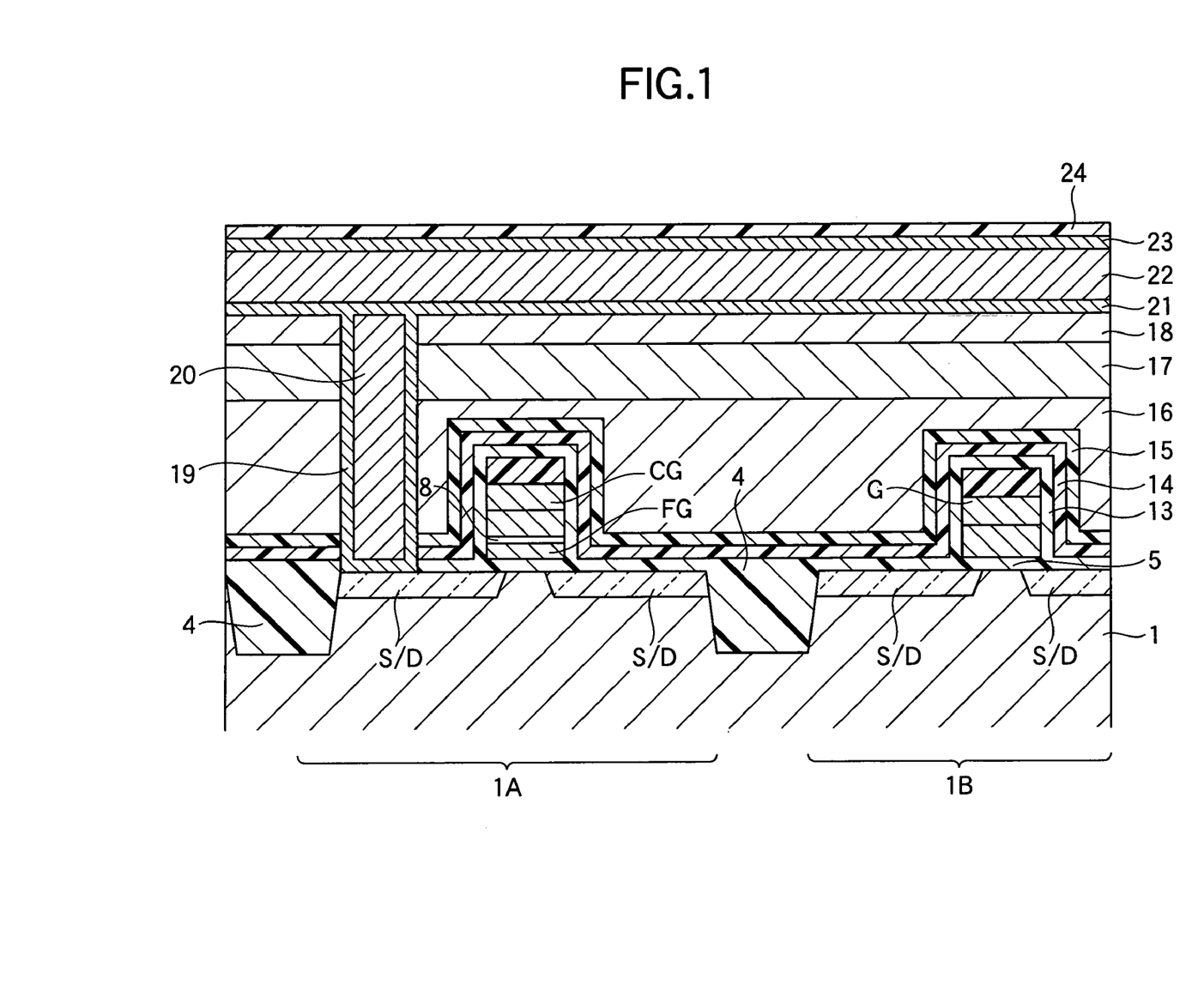
FIG. 1 is a sectional view showing a configuration of a nonvolatile semiconductor memory according to an embodiment of the present invention.

FIG. 1 is a sectional view showing a configuration of a nonvolatile semiconductor memory according to an embodiment of the present invention.

The nonvolatile semiconductor memory is configured to store data based on the presence or absence of electric charge stored in a memory cell having a floating gate FG insulated from its surroundings. The nonvolatile semiconductor memory includes a cell portion 1A in which the memory cell is formed, and a peripheral portion 1B in which a transistor or the like is formed. The cell portion 1A and the peripheral portion 1B are isolated from each other by means of an element isolation region composed of an insulation film (i.e., an STI film 4) formed on a Si substrate 1.

The STI film 4 is formed by depositing an HDP thin film on an inner surface of a trench (formed on the Si substrate 1) using CVD (Chemical Vapor Deposition) method without applying bias voltage, and then filling the trench with an HDP film using the CVD method while applying a bias voltage. The detail of the forming process of the STI film 4 will be described later. The surface of the Si substrate 1 on which the STI film 4 is formed is covered by an insulation film 5 composed of SiO. A floating gate FG is formed on the insulation film 5 at the memory cell portion of the cell portion 1A. A gate G is formed on the insulation film 5 at the transistor portion of the peripheral portion 1B. A control gate CG is formed on the floating gate FG via an oxide film 8.

The surface of the Si substrate 1 on which the control gate CG and the gate G are formed is covered by an oxide film 13, another oxide film 14 and a nitride film 15 in this order from below. A BPSG (Boro-Phospho Silicate Glass) film 16 is formed to cover the nitride film 15 to provide a planar surface. TEOS (Tetra Ethyl Ortho Silicate) films 17 and 18 are formed on the BPSG film 16 in this order from below.

Source/drain regions S/D are formed in the Si substrate 1 where ion is implanted via the control gate CG and the gate G. A contact hole is formed above the source/drain region S/D and penetrates the insulation film 5, the oxide films 13 and 14, the nitride film 15, the BPSG film 16 and the TEOS films 17 and 18. A tungsten (W) contact 20 whose circumferential surface is covered by the Ti/TiN film 19 is formed to fill the contact hole. A metal interconnection line 22 composed of Cu/Al is formed to cover the TEOS film 18 and the surface of the tungsten contact 20 via a Ti/TiN film 21. A Ti/TiN film 23 is formed to cover the metal interconnection line 22. A SiON film 24 is formed to cover the surface of the Ti/TiN film 23.

Figure 2:
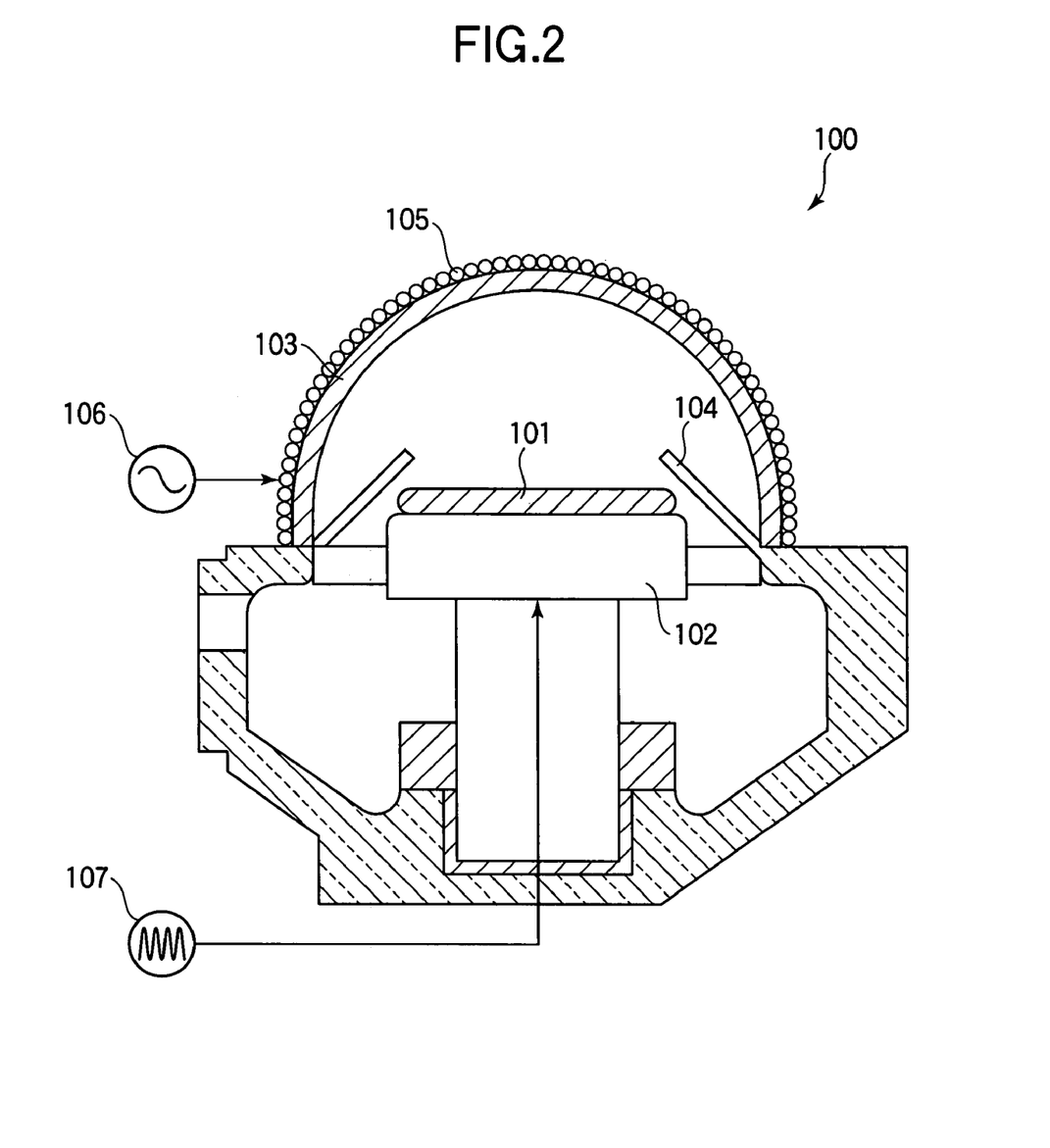
FIG. 2 is a schematic view showing a CVD apparatus used in a manufacturing method of the nonvolatile semiconductor memory shown in FIG. 1.

FIG. 2 is a schematic view showing a CVD apparatus.

The CVD apparatus 100 shown in FIG. 2 is used to form the STI film 4 or the like. The CVD apparatus 100 includes an electrostatic chuck 102 for holding a wafer 101 as an object to be processed, a bell-jar 103 as a processing container, and a gas injector 104 for injecting a material gas into the bell-jar 103. The bell-jar 103 is dome-shaped and is made of ceramics. An electrode 105 is provided on the outer surface of the bell-jar 103. A low-frequency power source 106 is provided to apply a low-frequency voltage via the electrode 105 to the material gas injected into the bell-jar 103, to thereby convert the material gas into plasma. A high-frequency power source 107 is provided to apply a bias voltage (high-frequency voltage) to the electrostatic chuck 102 for attracting the plasma to the wafer 101.

Figure 3A:
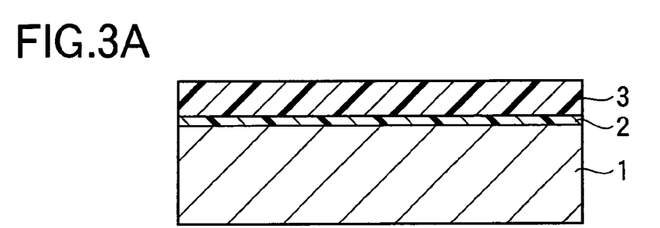
FIGS. 3A through 3G illustrate a manufacturing method of the nonvolatile semiconductor memory shown in FIG. 1.

FIGS. 3A though 7D illustrate the manufacturing method of the nonvolatile semiconductor memory shown in FIG. 1. Hereinafter, the manufacturing method of the nonvolatile semiconductor memory of FIG. 1 will be described with reference to FIGS. 2 through 7D.

<Step 1>

As shown in FIG. 3A, a pad oxide film 2 having the thickness of approximately 100 Å and a nitride film 3 having the thickness of approximately 1000 Å are formed on the Si substrate 1 in this order.

<Step 2>

Figure 3B:
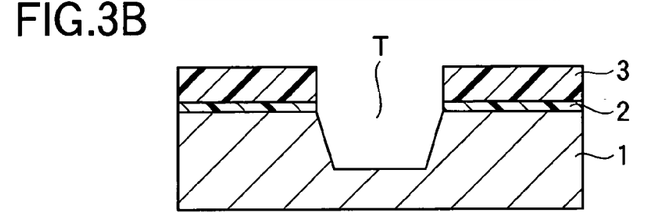

A resist for etching is coated on the surface of the nitride film 3, and a trench T is formed on a predetermined element isolation region using a conventional photolithography-etching technique as shown in FIG. 3B. The depth of the trench T is approximately 1800 Å at the cell portion 1A of the Si substrate 1, and is approximately 2000 Å at the peripheral portion 1B.

<Step 3>

Figure 3C:
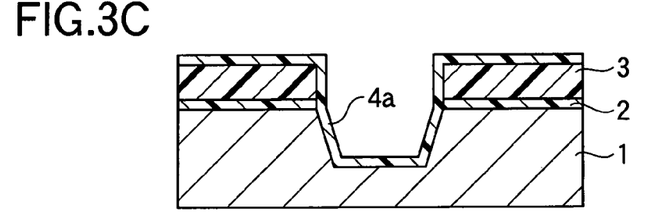

As shown in FIG. 3C, a trench oxide film 4a is formed on the inner surface of the trench T to the thickness of approximately 300 Å using the CVD apparatus of FIG. 2. The condition for growing the trench oxide film 4a is as follows:

flow rate of material gas $SiH_4$: 159 sccm (standard cc/min);
flow rate of material gas $O_2$: 300 sccm;
flow rate of material gas He: 325 sccm;
electric power of low-frequency power source (400 KHz): 3850 W;
electric power of high-frequency power source (13.56 MHz): 0 W, and
growing time: 2 seconds.

In this step, no high-frequency voltage (i.e., the bias voltage) is applied. Therefore, the nitride film 3 under the trench oxide film 4a is not electrically charged, and therefore no damage occurs on the Si substrate 1.

<Step 4>

Using the same CVD apparatus as in the step 3, an HDP oxide film 4b having the thickness of approximately 4700 Å is formed inside the trench oxide film 4a so that the trench T is filled with the HDP oxide film 4b. The condition for growing the HDP oxide film 4b is as follows:

flow rate of material gas $SiH_4$: 159 sccm;
flow rate of material gas $O_2$: 300 sccm;
flow rate of material gas He: 325 sccm;
electric power of low-frequency power source (400 KHz): 3850 W;
electric power of high-frequency power source (13.56 MHz): 2000 W, and
growing time: 55 seconds.

Figure 3D:
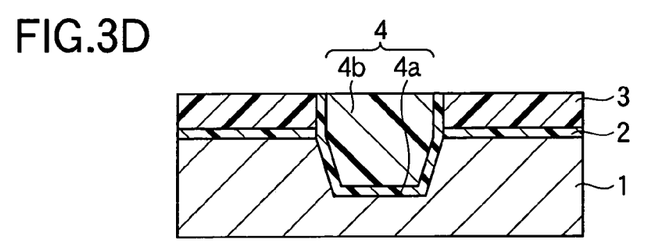
Figure 3E:
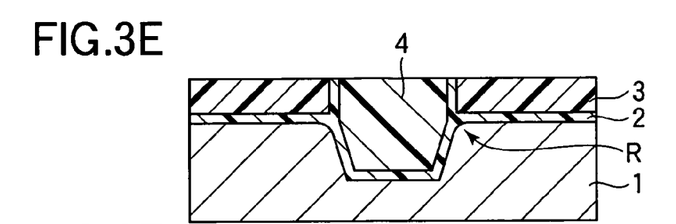

In this step, the bias voltage (i.e., high-frequency voltage) is applied as well as the low-frequency voltage, and therefore the HDP oxide film 4b having high density is formed on the trench oxide film 4a. Then, the surface of the HDP oxide film 4b is polished using CMP (Chemical Mechanical Polishing) to uniformly planarize the surface of the HDP oxide film 4b. As a result, the isolation structure using the STI film 4 is obtained as shown in FIG. 3D.

<Step 5>

Figure 3F:
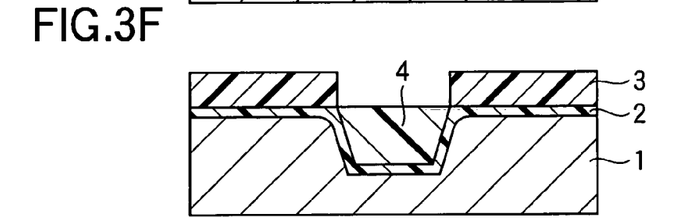

In order to remove convexes and concaves on the edge portion of the STI film 4, a bird's-beak oxidation is performed to the thickness of approximately 300 Å. To be more specific, a heat processing is performed in a diffusion furnace at the temperature of 950° C. in a wet atmosphere. With the heat processing, the Si substrate 1 is oxidized so that the oxide film extends under the nitride film 3. As a result, the edge (around the trench) of the Si substrate 1 is rounded as shown by an arrow R in FIG. 3E, so that convex and concaves on the edge portion of the STI film 4 are removed. Due to the bird's-beak oxidation, the HDP film is annealed. Then, the oxide film 4b is removed by etching as shown in FIG. 3F.

<Step 6>

Figure 3G:
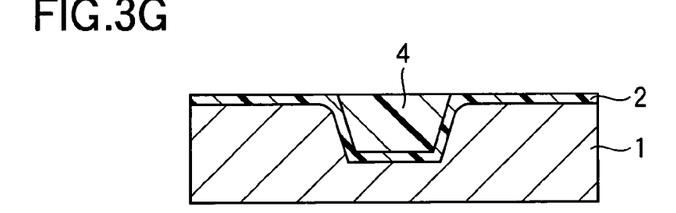

Further, the nitride film 3 is removed by etching as shown in FIG. 3G. With this step, the Si substrate 1 having no damage on the surface thereof, and having the element isolation region formed of the STI film 4 with no divot on the edge portion thereof is obtained.

<Step 7>

Figure 4A:
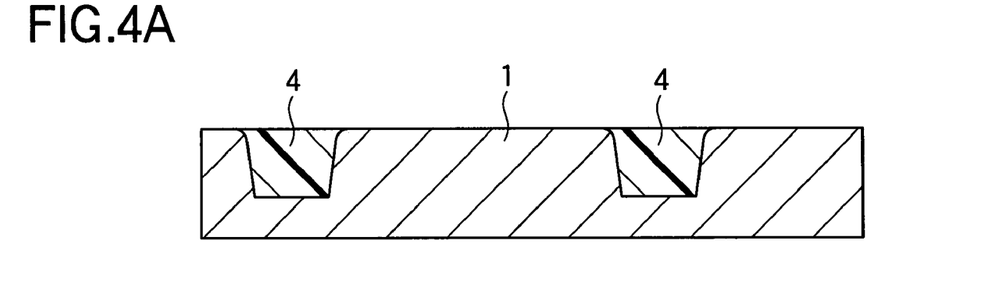
FIGS. 4A through 4D illustrate the manufacturing method of the nonvolatile semiconductor memory shown in FIG. 1.

As shown in FIG. 4A, the pad oxide film 2 is removed by etching.

<Step 8>

Figure 4B:
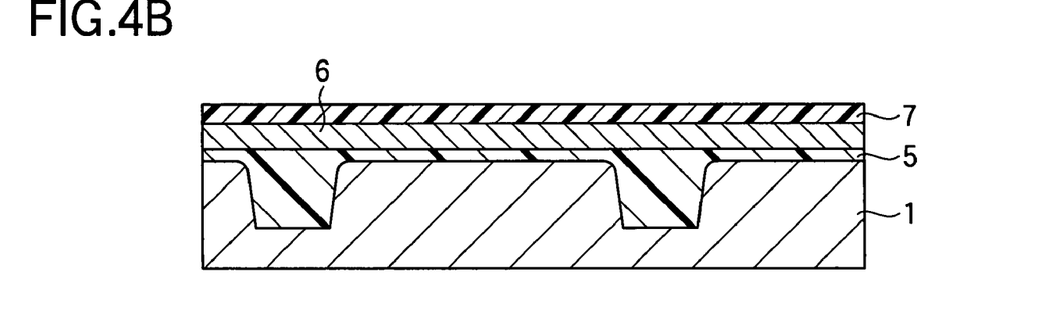

The surface of the Si substrate 1 from which the pad oxide film 2 has been removed is oxidized to form the insulation film 5 having the thickness of approximately 100 Å as shown in FIG. 4B. A poly-silicon film 6 having the thickness of approximately 500 Å is formed on the insulation film 5 using the CVD method. A sacrificial film (insulation film) 7 composed of LP (Low Pressure)-TEOS-SiO having the thickness of approximately 70 Å is formed on the poly-silicon film 6 using the CVD method. Further, $P^+$ ion is implanted into the poly-silicon film 6 via the sacrificial film 7.

<Step 9>

Figure 4C:
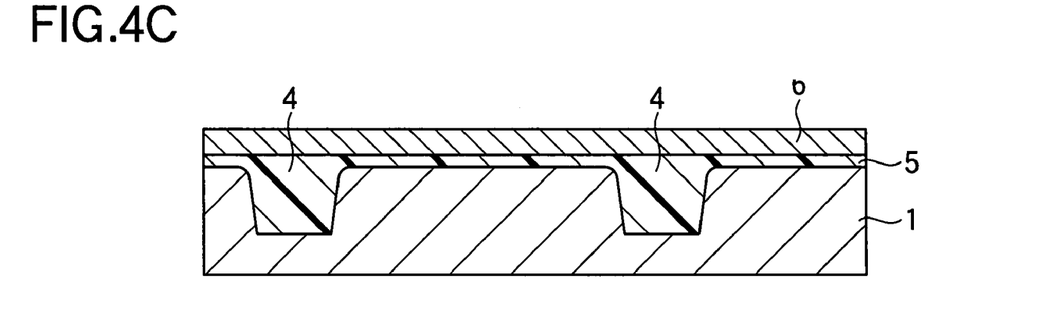

As shown in FIG. 4C, the sacrificial film 7 is removed by etching. Then, the annealing of the poly-silicon film 6 is performed in a furnace at the temperature of approximately 800° C. for approximately 15 minutes.

<Step 10>

Figure 4D:
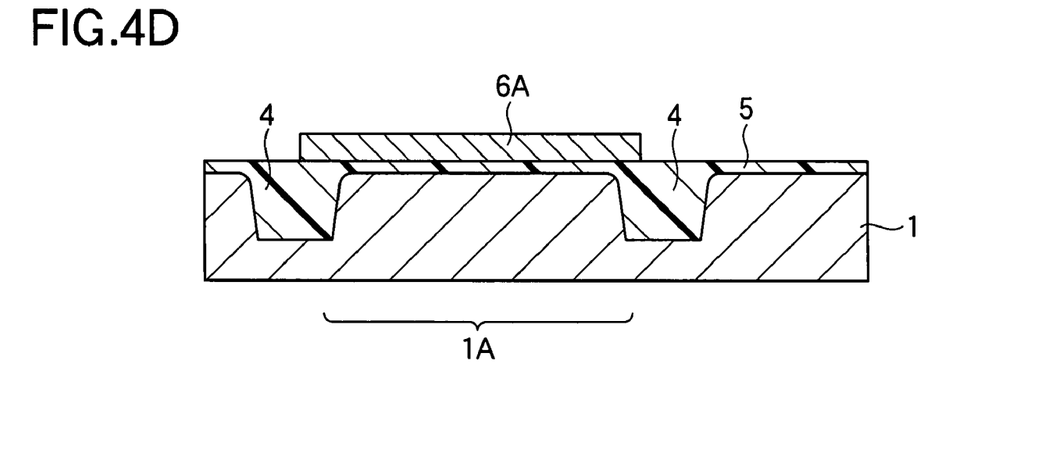

A resist for etching is coated on the surface of the poly-silicon film 6. Then, the poly-silicon film 6 except at the cell portion 1A is removed using the photolithography-etching technique. With this step, the poly-silicon film 6A remains at the cell portion 1A as shown in FIG. 4D.

<Step 11>

Figure 5A:
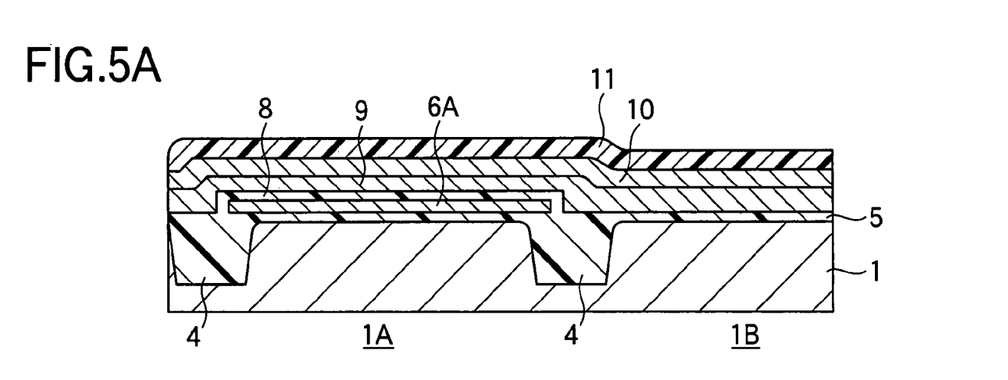
FIGS. 5A through 5D illustrate the manufacturing method of the nonvolatile semiconductor memory shown in FIG. 1.

On the surface of the Si substrate 1 on which the poly-silicon film 6A remains at the cell portion 1A, an oxide film 8 having the thickness of approximately 80 Å is formed. Further, a poly-silicon film 9 having the thickness of approximately 1000 Å is formed on the surface of the oxide film 8, using the CVD method. Then, the annealing of the poly-silicon film 9 is performed in the furnace at the temperature of approximately 900° C. for approximately 30 minutes. Then, as shown in FIG. 5A, a tungsten silicide (WSi) film 10 having the thickness of approximately 700 Å is formed on the surface of the poly-silicon film 9 using the CVD method. Further, an oxide film 11 composed of PE (Plasma Enhanced)-TEOS-SiO having the thickness of approximately 700 Å is formed on the tungsten silicide film 10 using the CVD method.

<Step 12>

Figure 5B:
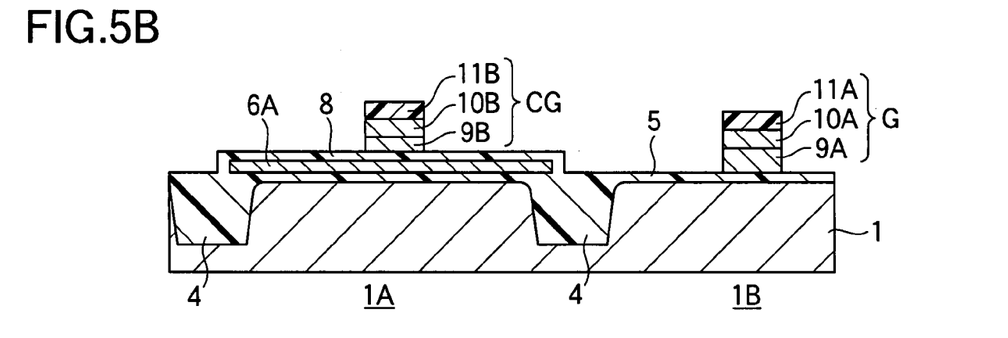

A resist for etching is coated on the oxide film 11. Then, the oxide film 11, the tungsten silicide film 10 and the poly-silicon film 9 except at the control gate CG of the cell portion 1A and at the gate G of the peripheral portion 1B are removed using photolithography-etching technique. With this step, as shown in FIG. 5B, the control gate CG (i.e., the poly-silicon film 9B, the tungsten silicide film 10B and the oxide film 11B) remains at the cell portion 1A, and the gate G (i.e., the poly-silicon film 9A, the tungsten silicide film 10A and the oxide film 11A) remains at the peripheral portion 1B.

<Step 13>

Figure 5C:
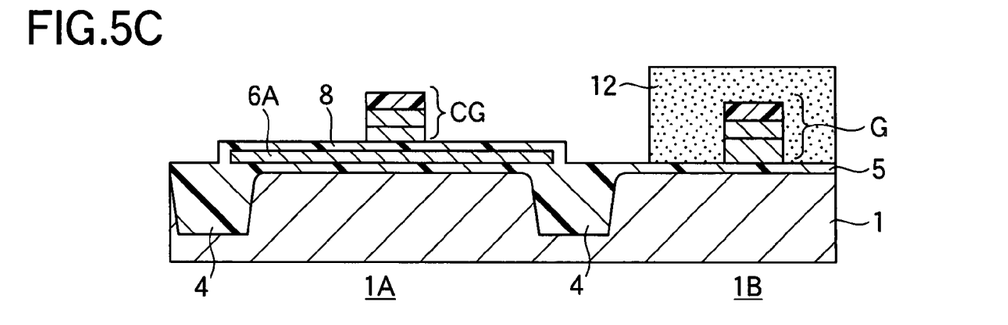

In order to form the floating gate FG of the cell portion 1A, as shown in FIG. 5C, a resist 12 is formed to cover (protect) the gate G of the peripheral portion 1B.

<Step 14>

Figure 5D:
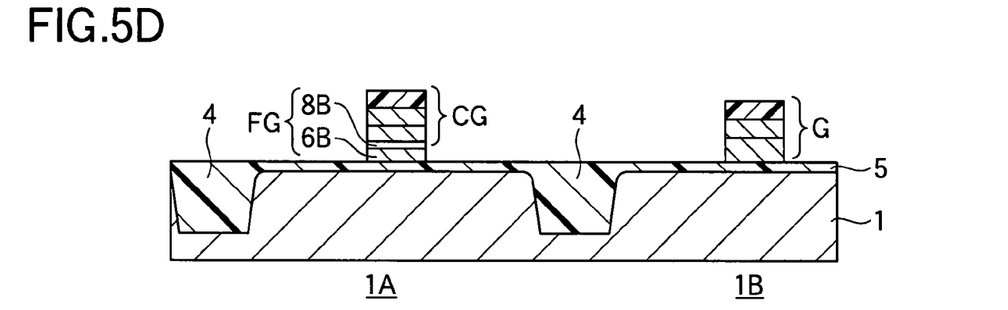

Using the control gate CG of the cell portion 1A as the mask, the oxide film 8 and the poly-silicon film 6A surrounding the control gate CG are removed by etching, so that the floating gate FG (composed of the oxide film 8B and the poly-silicon film 6B) is formed below the control gate CG. Then, the resist 12 is removed by resist removal process, with the result that the gates of the cell portion 1A and the peripheral portion 1B are completed as shown in FIG. 5D.

<Step 15>

Figure 6A:
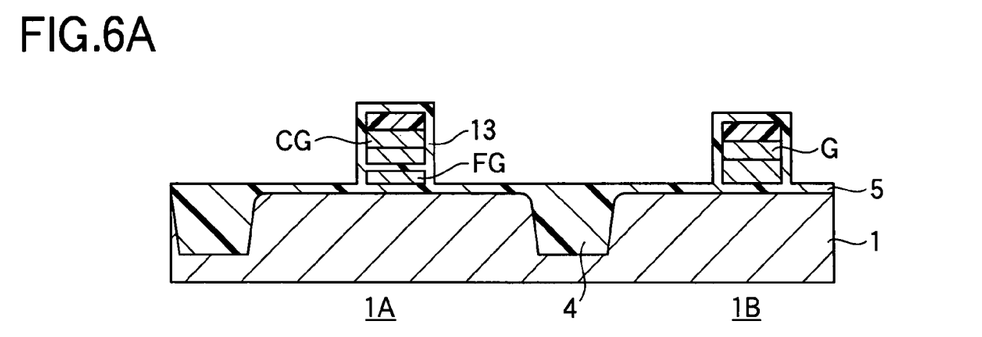
FIGS. 6A through 6D illustrate the manufacturing method of the nonvolatile semiconductor memory shown in FIG. 1, and FIGS. 7A through 7D illustrate the manufacturing method of the nonvolatile semiconductor memory shown in FIG. 1.

The Si substrate 1 (on which the gates are formed) is thermally oxidized in the furnace at the temperature of approximately 1000° C. so that a mask oxide film 13 having the thickness of approximately 100 Å is formed on the entire surface of the Si substrate 1 as shown in FIG. 6A.

<Step 16>

Figure 6B:
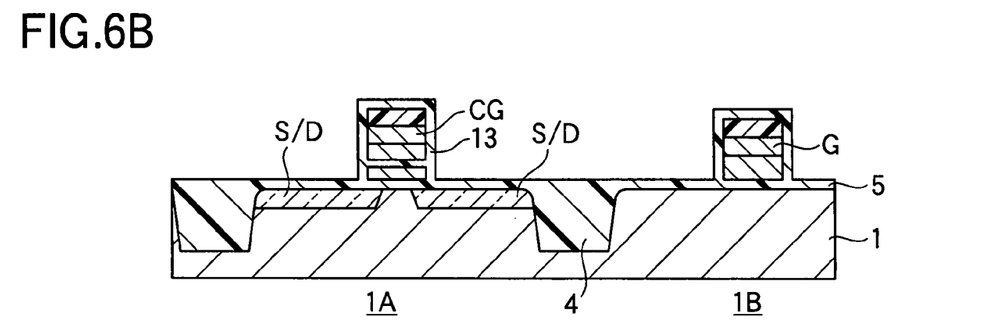

Next, a mask for ion injection is formed on the surface of the mask oxide film 13, and $As^+$ ion is implanted into the Si substrate 1 on the lower sides of the floating gate FG. Then, the mask is removed by resist removal process. With this step, the source/drain regions S/D composed of ion diffusion layers are formed at the cell portion 1A, with the result that the memory cell of the cell portion 1A is completed as shown in FIG. 6B.

<Step 17>

Figure 6C:
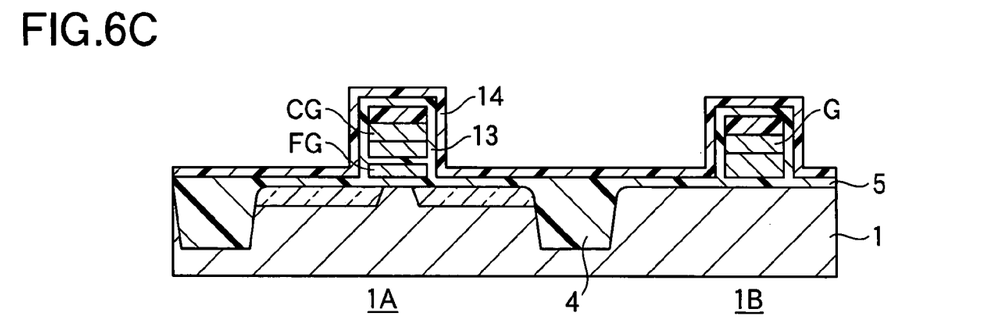

As shown in FIG. 6C, a SW (sidewall) oxide film 14 having the thickness of approximately 300 Å is formed on the entire surface of the mask oxide film 13 using the CVD method.

<Step 18>

Figure 6D:
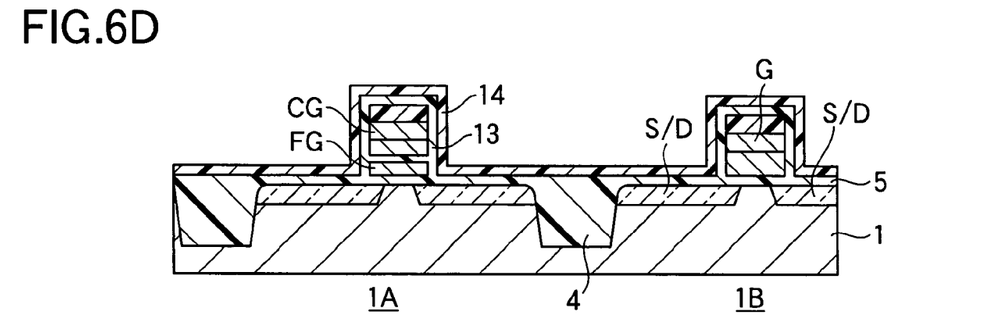

A mask for ion injection is formed on the surface of the SW oxide film 14, and $BF^{2+}$ ion is implanted into the Si substrate 1 on the lower sides of the gate G of the peripheral portion 1B. Then, the mask is removed by resist removal process. With this step, as shown in FIG. 6D, the source/drain regions S/D composed of ion diffusion layers are formed at the peripheral portion 1B, so that the transistor of the peripheral portion 1B is completed.

<Step 19>

Figure 7A:
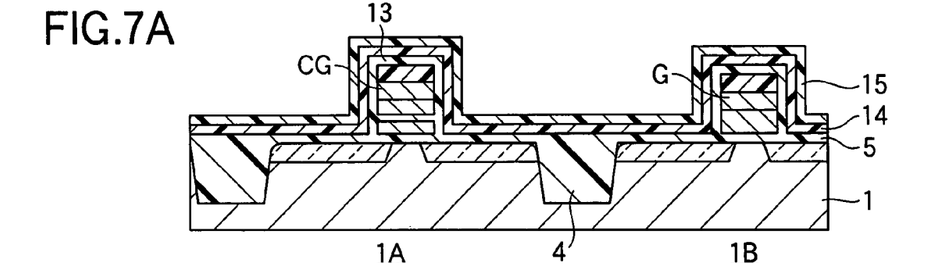

As shown in FIG. 7A, a nitride film 15 having the thickness of approximately 150 Å is formed on the SW oxide film 14 on the Si substrate 1 (on which the memory cell and the transistor are completed) using the CVD method.

<Step 20>

Figure 7B:
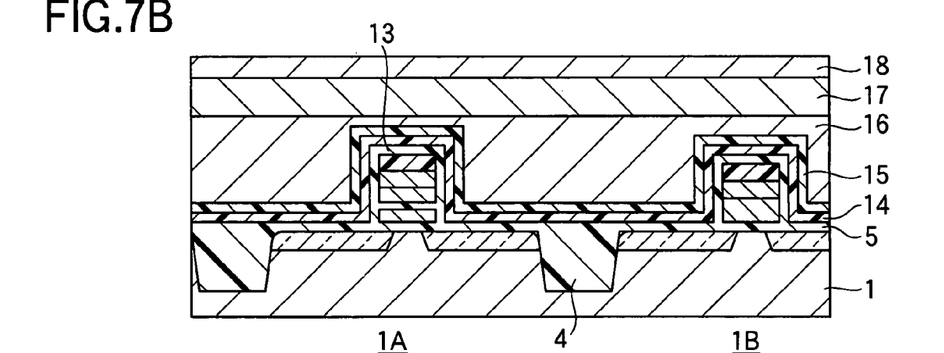

A BPSG film 16 is coated on the surface of the nitride film 15, and is molten in the furnace at the temperature of approximately 750° C. for approximately 90 minutes. As shown in FIG. 7B, the entire surface of the nitride film 15 is covered by the BPSG film 16 to form a plane surface having no convex or concave. Then, a PE-TEOS-SiO film 17 having the thickness of approximately 6000 Å is formed on the BPSG film 16 using the CVD method. Further, an LP-TEOS-SiO film 18 having the thickness of approximately 1000 Å is formed on the PE-TEOS-SiO film 17 using the CVD method.

<Step 21>

Figure 7C:
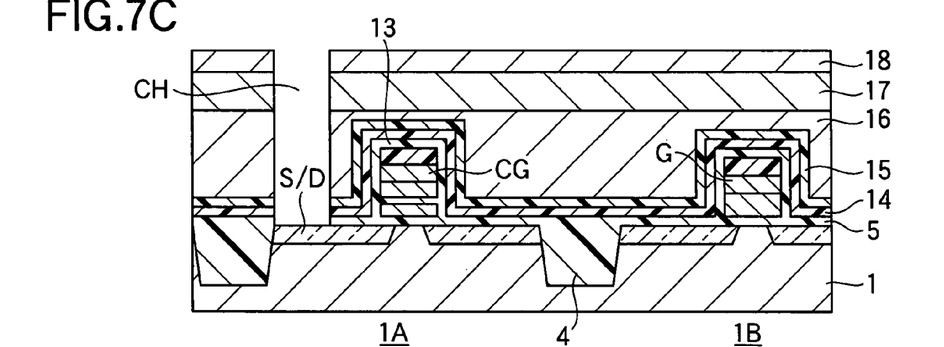

A resist for etching is coated on the surface of the PE-TEOS-SiO film 18, and a contact hole CH is formed using photolithography-etching technique, as shown in FIG. 7C. The contact hole CH penetrates the LP-TEOS-SiO film 18, the PE-TEOS-SiO film 17, the BPSG film 16, the nitride film 15, the SW oxide film 14 and the insulation film 5, and reaches the source/drain region (diffusion region) S/D.

<Step 22>

Figure 7D:
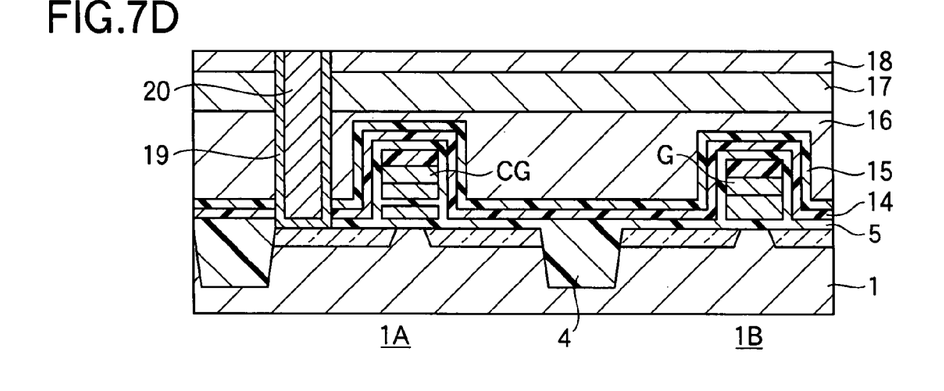

As shown in FIG. 7D, a Ti/TiN film 19 composed of a TiSi film of approximately 250 Å and a TiN film of approximately 100 Å is formed on the inner surface of the contact hole CH using the CVD method, and a tungsten contact 20 having the thickness of approximately 3000 Å is formed using the CVD method so that the contact hole CH is filled with the tungsten contact 20.

<Step 23>

Then, a Ti/TiN film 21, a metal interconnection line 22 composed of Cu/Al, and a Ti/TiN film 23 are vapor-deposited in this order on the surface of the LP-TEOS-SiO film 18 (in which the contact is formed) to form a predetermined inter-connection pattern. Then, a SiON film 24 is formed to cover the interconnection pattern. As a result, the nonvolatile semi-conductor memory as shown in FIG. 1 is completed.

As described above, the nonvolatile semiconductor memory of this embodiment uses the STI film 4 (as the element isolation region) composed of the non-charged trench oxide film 4a formed on the inner surface of the trench T to the thickness of approximately 300 Å in the step 3 and the HDP oxide film 4b formed inside the trench oxide film 4a to the thickness of approximately 4700 Å in the step 4. Therefore, the nitride film 3 under the trench oxide film 4a of the STI film 4 is not electrically charged. As a result, no damage occurs on the Si substrate 1, and no degradation of the insulation film 5 below the floating gate FG occurs, so that the insulation film having high reliability can be obtained. Furthermore, in the step 5, the convexes and concaves of the edge portion of the STI film 4 is removed by the bird's-beak oxidation. Therefore, the occurrence of the leak pass can be prevented, and the insulation film (i.e., the STI film 4) having higher reliability can be obtained.

The present invention is not limited to the above described embodiment, but can be modified in the various ways. For example, the following modification can be made.

(A) The conditions for growing the trench oxide film 4a and the HDP oxide film 4b in the steps 3 and 4 are merely examples, and it is not necessary to properly follow the above described numerical value. For example, in the above described step 3, the trench oxide film 4a is formed without applying a bias voltage. However, it is also possible to form the trench oxide film 4a in the step 3 while applying a relatively low bias voltage compared with the bias voltage applied in the step 4. Further, numerical values in other steps are merely examples, and can be varied within the range approximately from −10% to 10%.

(B) The manufacturing process of the memory cell or the like in the step 7 or later is merely an example, but other manufacturing process can be applicable.

(C) The steps 3 through 5 are not limited to the nonvolatile semiconductor memory, but are applicable to the forming of the STI film of other semiconductor device.

(D) In the above described embodiment, the Si substrate is used as the semiconductor substrate. However, an SOI (Silicon On Insulator) substrate in which an Si film is formed on an insulation substrate such as glass or the like can also be used.

As described above, according to the embodiment of the present invention, the insulation film for element isolation (to be filled in the trench T formed in the element isolation region) is formed by the following first and second steps. In the first step, the material in a plasma state including oxygen and silicon is deposited on the inner surface of the trench T while applying no bias voltage (or by applying relatively low voltage). In the second step, the trench T is filled with the material in the plasma state including oxygen and silicon by applying a bias voltage (or by applying relatively high voltage). Therefore, the nitride film 3 under the trench oxide film 4a is not electrically charged, and therefore no damage occurs on the Si substrate 1. Accordingly, the insulation film (i.e., the STI film 4) having higher reliability can be obtained. Such an insulation film having high reliability is suitable for an insulation film of a nonvolatile semiconductor memory that stores data by means of electric charge stored on the floating gate.

While the preferred embodiments of the present invention have been illustrated in detail, it should be apparent that modifications and improvements may be made to the invention without departing from the spirit and scope of the invention as described in the following claims.

What is claimed is:

1. A method for forming an element isolation film by filling a trench formed in an element isolation region of a semiconductor substrate with an oxide to thereby form an insulation film for element isolation, said method comprising:

a first step of depositing a material in a plasma state including oxygen and silicon on an inner surface of said trench;

a second step of filling said trench with a material in a plasma state including oxygen and silicon while applying a bias voltage, so as to form said element isolation film; and after said first and second steps, performing a third step of bird's-beak oxidation to remove convexes and concaves on an edge portion of said element isolation film and causing said element isolation film to be annealed, wherein in said first step, said material is applied with no bias voltage or a relatively low bias voltage compared with said bias voltage applied in said second step.

2. The method according to claim 1, wherein said first step and said second step are carried out continuously in a same apparatus.

3. The method according to claim 1, wherein said third step of bird's-beak oxidation includes performing a heating process in a diffusion furnace.

* * * * *